(12) United States Patent
Jaeger

(10) Patent No.: US 6,806,309 B2
(45) Date of Patent: Oct. 19, 2004

(54) ADHESIVE COMPOSITIONS CONTAINING ORGANIC SPACERS AND METHODS FOR USE THEREOF

(75) Inventor: Richard E. Jaeger, San Diego, CA (US)

(73) Assignee: Henkel Corporation, Rocky Hill, CT (US)

( * ) Notice: Subject to any disclaimer, the term of this patent is extended or adjusted under 35 U.S.C. 154(b) by 137 days.

(21) Appl. No.: 10/087,191

(22) Filed: Feb. 28, 2002

(65) Prior Publication Data

US 2003/0230814 A1 Dec. 18, 2003

(51) Int. Cl.⁷ .............................................. C08F 32/02
(52) U.S. Cl. ....................... 524/548; 524/520; 524/516; 523/223; 438/118; 438/119; 438/109; 438/113
(58) Field of Search ................................. 524/548, 520, 524/516; 523/223; 438/118, 119, 109, 113

(56) References Cited

U.S. PATENT DOCUMENTS

| | | | |
|---|---|---|---|
| 3,406,053 A | 10/1968 | Jaenlcke et al. | ............. 156/309 |
| 3,655,482 A | 4/1972 | Schildkraut et al. | ........ 156/276 |
| 4,054,714 A | 10/1977 | Mastrangelo | |
| 5,232,962 A | * 8/1993 | Dershem et al. | ............. 523/442 |
| 5,447,988 A | 9/1995 | Dershem et al. | ............. 524/780 |
| 5,717,034 A | * 2/1998 | Dershem et al. | ............. 525/276 |
| 6,034,194 A | * 3/2000 | Dershem et al. | ............. 526/262 |
| 6,034,195 A | 3/2000 | Dershem et al. | ............. 526/262 |
| 6,288,170 B1 | 9/2001 | Waid | |
| 6,472,758 B1 | 10/2002 | Glenn et al. | ................ 257/777 |

OTHER PUBLICATIONS

International Search Report for international application PCT/US03/06284.

* cited by examiner

*Primary Examiner*—David W. Wu
*Assistant Examiner*—Satya B Sastri
(74) *Attorney, Agent, or Firm*—Steven C. Bauman

(57) ABSTRACT

In accordance with the present invention, there are provided adhesive compositions and methods for use thereof, comprising at least one maleimide-containing monomer, at least one cure initiator, and a plurality of spacer elements constructed from one or more organic polymers. Invention adhesive compositions are useful for controlling bond line thickness and planarity between a device and a substrate. Bond line thickness and planarity is largely determined by the size of the spacer elements in the adhesive composition.

42 Claims, No Drawings

ADHESIVE COMPOSITIONS CONTAINING ORGANIC SPACERS AND METHODS FOR USE THEREOF

FIELD OF THE INVENTION

The present invention relates to adhesive bonding, and more particularly, to the bonding of surfaces wherein the control of bond line thickness and uniformity is desirable, as for example, in the packaging of semiconductor devices.

BACKGROUND OF THE INVENTION

Reliable performance of electronic devices depends primarily on the integrity of the microelectronic components contained therein. Most electronic devices contain several microchips which are housed in a variety of protective packages. These protective packages often contain a variety of adhesive pastes which play an important role in maintaining the integrity of the package and thereby the performance of the microchip housed therein.

The recent production of electronic components containing microchips which are stacked one on top of another (commonly referred to as "stacked die") presents challenges to the microelectronic packaging industry. For example, spacing between each die must be effectively controlled to allow for reliable wire bonding between die. Moreover, the recent trend toward thinner dies increases the propensity of the die to warp, resulting in non-planarity across the surface of the die (also a contributing factor to unreliable wire bonding). Thus, an adhesive used in a stacked die application ideally provides reproducible bond line thickness in addition to uniform planarity across the entire bondline.

In addition, interfacial stress that arises from a thermal mismatch between the die and substrate is directly proportional to both the area of attachment and the modulus of elasticity of the bonding adhesive. This stress is also inversely proportional to the bond line thickness. Since the modulus of elasticity for a given die attach adhesive is substantially fixed, alternative methods to reduce interfacial stress must be employed, e.g., via bond line control between a given set of components. If the bond line thickness is sufficient, the resultant bond will exhibit good resistance to differential thermal expansion rates between each semiconductor die and substrate and will produce a bond having a high tensile strength.

Accordingly, there is a need for effective methods to control bond line and planarity in the packaging of semiconductor devices.

SUMMARY OF THE INVENTION

In accordance with the present invention, there are provided adhesive compositions useful for effectively controlling bondline thickness and planarity. Invention adhesive compositions comprise at least one maleimide-containing monomer, optionally at least one cure initiator, and a plurality of spacers constructed from one or more organic polymers. Invention adhesive compositions are particularly useful for controlling bond line thickness and planarity between a device and a substrate, or between semiconductor dies in a stacked die package. Bond line thickness and planarity are largely determined by the size of the spacers in the adhesive composition.

In further aspects of the invention, there are provided methods for creating a substantially uniform bond line between a device and a substrate, for controlling adhesive gap thickness between a device and a substrate, for controlling planarity across an adhesive bond line, for creating substantially uniform bond lines between at least one semiconductor die attached to a substrate in a stacked arrangement, and for adhesively attaching at least two semiconductor dies to substrate in a stacked arrangement without the need for a spacer die.

In an additional aspect of the invention, there are provided assemblies comprising a first article adhered to a second article by a cured aliquot of invention adhesive composition.

DETAILED DESCRIPTION OF THE INVENTION

In accordance with the present invention, there are provided adhesive compositions comprising at least one maleimide-containing monomer, optionally at least one cure initiator, and a plurality of spacers constructed from one or more organic polymers.

Spacers contemplated for use in the practice of the present invention are substantially spherical, and typically have a particle size in the range of about 0.02 mils up to about 25 mils. Preferably, the spacers have a particle size in the range of about 0.1 mils up to about 15 mils. As employed herein, "mil" is a unit of measure equal to $1/1000$ of an inch. Before, during, and after curing of invention adhesive formulations, the integrity of the spacers is maintained, i.e., the size and shape of the spacers remains substantially constant before, during, and after cure. For example, the spacers preferably do not swell, soften, or dissolve upon incorporation into the adhesive composition. Additionally, spacers contemplated for use in the practice of the present invention are preferably hydrophobic.

Spacers contemplated for use in the practice of the present invention optionally contain reactive moieties which allow the spacers to crosslink with other components in the adhesive composition. As employed herein, "reactive moiety" refers to a functional group, which reacts with at least one other component in the composition.

Since it is well-established that many thermosetting compositions shrink upon cure (i.e., as the three-dimensional polymeric network is formed), spacers contemplated for use in the practice of the present invention also have the ability to shrink to some degree during cure, so as not to damage the surface of the articles or substrates to be adhered. Indeed, the modulus of the spacer is preferably less than the modulus of the articles or substrates to be adhered, so as not to damage the surface of the articles. For example, the spacer is preferably softer than a silicon die, so that spacers present in an adhesive composition dispensed on the surface of a die will not damage the surface of the die.

A particularly attractive benefit provided by invention compositions is the ability to control bond line thickness and planarity by appropriate choice of spacer as a component of the adhesive composition. Bond line thickness is thereby pre-determined by the appropriate choice of adhesive composition, which is a desirable alternative to the often laborious and uneconomical prior methods of controlling bond line thickness on a die-component placement machine.

Organic polymers from which spacers are constructed are substantially uncrosslinked. Those of skill in the art readily recognize that "uncrosslinked polymers" refers to polymers which are substantially free of covalent bonds between individual polymer chains. The polymers are typically the polymerization product of optionally substituted ethylenically unsaturated monomers. As employed herein, "ethylenically unsaturated monomers" refers to monomers having at least one localized (i.e., non-aromatic) carbon-carbon double bond, as shown below:

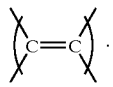

Monomers contemplated for use in the practice of the present invention include, for example, α-olefins, (meth)acrylates, vinyl esters, acrylamides, acrylonitriles, and the like. Preferably, the organic polymers are the polymerization or copolymerization products of (meth)acrylates. Most preferably, the organic polymer is polymethylmethacrylate. The organic polymers contemplated for use as spacers typically have a molecular weight in the range of about 50,000 up to about 1,500,000. Preferably, the organic polymers have a molecular weight in the range of about 400,000 up to about 500,000.

Prior to incorporation into an adhesive formulation, the spacers are typically sieved to produce sets of particles wherein each set contains particle sizes which fall within a well-defined range. The particle size range chosen for incorporation into an adhesive composition will depend on the desired bond line thickness for a given package. For example, one may choose a sieve with a −120, +140 mesh, such that substantially no spacers of a particle size greater than about 5 mils will be present after sieving.

Maleimide-containing monomers contemplated for use in the practice of the present invention have the following structure:

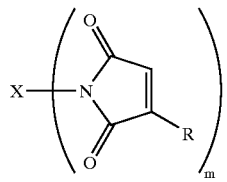

wherein:
$m = 1-6$,
each R is independently selected from hydrogen or lower alkyl, and
X is a monovalent moiety or a multivalent linking moiety.

Monovalent moieties or multivalent linking moieties are typically selected from
(I) straight or branched chain alkyl, alkylene, oxyalkylene, alkenyl, alkenylene, oxyalkenylene, ester, or polyester, optionally containing substituents selected from hydroxy, alkoxy, carboxy, nitrile, cycloalkyl or cycloalkenyl,
(II) siloxanes having the structure:

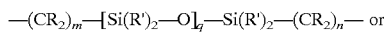

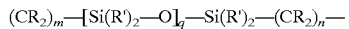

wherein
each R is independently defined as above, and
each R' is independently selected from hydrogen, lower alkyl or aryl, m' falls in the range of 1 up to 10, n' falls in the range of 1 up to 10, and q' falls in the range of 1 up to 50, (III) polyalkylene oxides having the structure:

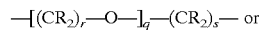

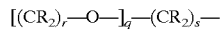

wherein each R is independently as defined above, r falls in the range of 1 up to 10, s falls in the range of 1 up to 10, and q' is as defined above, (IV) aromatic moieties having the structure:

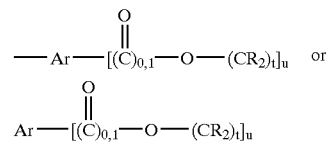

wherein each R is independently as defined above, t falls in the range of 2 up to 10, u is 1, 2 or 3, and Ar is as defined above, or

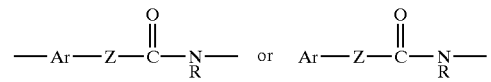

wherein
Z is O or NR, wherein R is hydrogen or lower alkyl, (V) urethanes having the structure

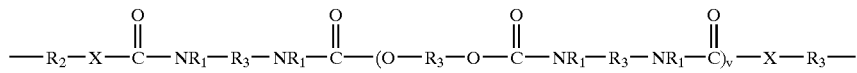

wherein:
each $R_1$ is independently hydrogen or lower alkyl,
each $R_2$ independently is an alkyl, aryl, or arylalkyl group having 1 to 18 carbon atoms;
$R_3$ is an alkyl or alkyloxy chain having up to about 100 atoms in the chain, which chain may contain aryl substituents;
X is O, S, N, or P; and
V is 0 to 50, (VI) aromatic moieties having the structure:

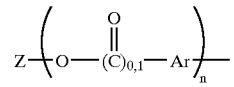

wherein
each Ar is a monosubstituted, disubstituted or trisubstituted aromatic or heteroaromatic ring having in the range of 3 up to about 10 carbon atoms, n is 1 up to about 50, and Z is selected from:

straight or branched chain alkyl, alkylene, oxyalkylene, alkenyl, alkenylene, oxyalkenylene, ester, or polyester, optionally containing substituents selected from hydroxy, alkoxy, carboxy, nitrile, cycloalkyl or cycloalkenyl, siloxanes having the structure:

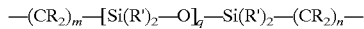

wherein:

each R is independently defined as above, and each R' is independently selected from hydrogen, lower alkyl or aryl, m' falls in the range of 1 up to 10, n' falls in the range of 1 up to 10, and q' falls in the range of 1 up to 50, polyalkylene oxides having the structure:

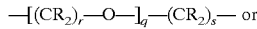

wherein each R is independently as defined above, r falls in the range of 1 up to 10, s falls in the range of 1 up to 10, and q' is as defined above, aromatic moieties having the structure:

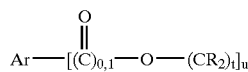

wherein each R is independently as defined above, t falls in the range of 2 up to 10, u is 1, 2 or 3, and Ar is as defined above, as well as mixtures of any two or more thereof.

As employed herein, "alkyl" refers to hydrocarbyl radicals having 1 up to about 20 carbon atoms, preferably 2–10 carbon atoms; and "substituted alkyl" comprises alkyl groups further bearing one or more substituents selected from hydroxy, alkoxy, mercapto, cycloalkyl, substituted cycloalkyl, heterocyclic, substituted heterocyclic, aryl, substituted aryl, heteroaryl, substituted heteroaryl, aryloxy, substituted aryloxy, halogen, cyano, nitro, amino, amido, C(O)H, acyl, oxyacyl, carboxyl, carbamate, sulfonyl, sulfonamide, sulfuryl, and the like.

As employed herein, "cycloalkyl" refers to cyclic ring-containing groups containing in the range of 3 up to about 8 carbon atoms, and "substituted cycloalkyl" refers to cycloalkyl groups further bearing one or more substituents as set forth above.

As employed herein, "alkenyl" refers to straight or branched chain hydrocarbyl groups having at least one carbon-carbon double bond, and having in the range of 2 up to about 12 carbon atoms, and "substituted alkenyl" refers to alkenyl groups further bearing one or more substituents as set forth above.

As employed herein, "cycloalkenyl" refers to cyclic ring-containing groups containing in the range of 3 up to about 8 carbon atoms, wherein the cyclic ring-containing group contains at least one carbon-carbon double bond. "Substituted cycloalkenyl" refers to cycloalkenyl groups further bearing one or more substituents as set forth above. Cycloalkenyl groups as defined herein also refer to bicycloalkenyl groups, such as, for example, 2.2.1.-bicycloheptene, and the like.

As employed herein, "aryl" refers to aromatic groups having in the range of 6 up to about 14 carbon atoms and "substituted aryl" refers to aryl groups further bearing one or more substituents as set forth above.

As employed herein, "alkylene" refers to divalent hydrocarbyl radicals having 1 up to about 20 carbon atoms, preferably 2–10 carbon atoms; and "substituted alkylene" comprises alkylene groups further bearing one or more substituents as set forth above.

As employed herein, "alkenylene" refers to divalent, straight or branched chain hydrocarbyl groups having at least one carbon-carbon double bond, and having in the range of 2 up to about 12 carbon atoms, and "substituted alkenylene" refers to alkenylene groups further bearing one or more substituents as set forth above.

As employed herein, "arylene" refers to divalent aromatic groups having in the range of 6 up to about 14 carbon atoms and "substituted arylene" refers to arylene groups further bearing one or more substituents as set forth above.

Adhesive compositions of the invention optionally contain at least one free radical initiator. As employed herein, the term "free radical initiator" refers to any chemical species which, upon exposure to sufficient energy (e.g., light, heat, or the like), decomposes into two parts which are uncharged, but which each possesses at least one unpaired electron. Preferred as free radical initiators for use in the practice of the present invention are compounds which decompose (i.e., have a half life in the range of about 10 hours) at temperatures in the range of about 70 up to 180° C.

Free-radical cure initiators contemplated for use in the practice of the present invention include for example, peroxides (e.g., peroxy esters, peroxy carbonates, hydroperoxides, alkylperoxides, arylperoxides, and the like) azo compounds, and the like. Preferably, free radical initiators contemplated for use in the practice of the present invention include peroxides (e.g., dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis(tert-butyl peroxyisopropyl)benzene, and tert-butyl hydroperoxide), azo compounds (e.g., 2,2'-azobis(2-methylpropanenitrile), 2,2'-azobis(2-methylbutanenitrile), and 1,1'-azobis(cyclohexanecarbonitrile)), and the like.

Alternatively, invention compositions cure without the need for a cure initiator. For example, invention compositions may cure upon exposure to electromagnetic radiation (e.g., visible light, ultraviolet light).

Adhesive compositions according to the present invention typically contain in the range of about 1 wt % up to about 95 wt % maleimide-containing monomer, in the range of about 0.2 wt % up to about 2.0 wt % cure initiator, and in the range of about 1 wt % up to about 95 wt % spacer. Preferably, invention adhesive compositions contain in the range of about 5 wt % up to about 85 wt % maleimide-containing monomer, and 1 wt % up to about 50 wt % spacer. Most preferably, invention adhesive compositions contain in the range of about 10 wt % up to about 75 wt % maleimide-containing monomer, and 1 wt % up to about 10 wt % spacer.

Adhesive compositions according to the invention optionally contain in the range of about 0.1 up to about 10 wt % of at least one coupling agent, based on the total weight of the composition. Preferably, when employed, the coupling agent is present in the range of about 0.2 wt % up to about 5 wt %. Coupling agents contemplated for use in the practice of the present invention include siloxanes, silicate esters, metal acrylate salts, titanates, and the like.

Invention adhesive compositions may optionally contain at least one filler. Fillers contemplated for optional use in the practice of the present invention are other than the spacers and may optionally be conductive (electrically and/or thermally). Electrically conductive fillers contemplated for use in the practice of the present invention include, for example, silver, nickel, gold, cobalt, copper, aluminum, graphite, silver-coated graphite, nickel-coated graphite, alloys of such metals, and the like, as well as mixtures thereof. Both powder and flake forms of filler may be used in the adhesive compositions of the present invention. Preferably, the flake has a thickness of less than about 2 microns, with planar dimensions of about 20 to about 25 microns. Flake employed herein preferably has a surface area of about 0.15 to 5.0 $m^2/g$ and a tap density of about 0.4 up to about 5.5 g/cc. It is presently preferred that powder employed in the practice of the invention has a diameter of about 0.5 to 15 microns. If present, the filler typically comprises in the range of about 1% up to about 95% by weight of the adhesive composition.

Thermally conductive fillers contemplated for optional use in the practice of the present invention include, for example, boron nitride, silicon carbide, diamond, graphite, beryllium oxide, magnesia, silica, alumina, and the like. The particle size of these fillers will be in the range of about 5 microns up to about 25 microns. Preferably, the particle size is about 20 microns.

Electrically and/or thermally conductive fillers are optionally (and preferably) rendered substantially free of catalytically active metal ions by treatment with chelating agents, reducing agents, nonionic lubricating agents, or mixtures of such agents. Such treatments are described in U.S. Pat. No. 5,447,988, which is incorporated by reference herein in its entirety.

Optionally, a filler may be used that is neither an electrical nor thermal conductor. Such fillers may be desirable to impart some other property to the adhesive formulation such as, for example, reduced thermal expansion of the cured adhesive, reduced dielectric constant, improved toughness, increased hydrophobicity, and the like. Examples of such fillers include perfluorinated hydrocarbon polymers (e.g., TEFLON™), thermoplastic polymers, thermoplastic elastomers, mica, fused silica, glass powder, and the like.

Invention adhesive compositions comprising at least one coupling agent and at least one filler typically contain in the range of about 1 wt % up to about 95 wt % at least one maleimide-containing monomer, in the range of about 0.2 wt % up to about 2.0 wt % at least one cure initiator, in the range of about 0.5 wt % up to about 5 wt % at least one coupling agent, in the range of about 1 wt % up to about 95 wt % at least one filler, and in the range of about 1 wt % up to about 50 wt % a spacer. Preferably, invention adhesive compositions contain in the range of about 5 wt % up to about 85 wt % maleimide-containing monomer, in the range of about 10 wt % up to about 85 wt % at least one filler, and in the range of about 1 wt % up to about 50 wt % spacer. Most preferably, invention adhesive compositions contain in the range of about 10 wt % up to about 75 wt % maleimide-containing monomer, in the range of about 30 wt % up to about 80 wt % at least one filler, and 1 wt % up to about 10 wt % spacer.

In a further aspect of the invention, there are provided die-attach pastes comprising invention adhesive compositions and optionally a filler different from the spacers constructed from one or more organic polymers. When present in an invention die-attach paste, the filler typically comprises in the range of about 10 up to 90 wt % of the total die-attach paste and the invention adhesive composition comprises in the range of about 10 up to 80 wt % of the total die-attach paste.

In another aspect of the invention, there are provided methods for creating a substantially uniform bond line between a device and a substrate comprising subjecting a sufficient quantity of an invention adhesive composition positioned between the substrate and the device to conditions suitable to cure the adhesive composition, wherein spacers control bond line thickness between the device and the substrate. In particular, the bond line thickness is determined by the size of the spacers. Devices contemplated for use in the practice of the present invention include any surface mount component such as, for example, semiconductor die, resistors, capacitors, and the like. Preferably, devices contemplated for use in the practice of invention methods are semiconductor dies. Substrates contemplated for use include metal substrates (e.g., lead frames) and organic substrates (e.g., laminates, ball grid arrays, polyamide films, and the like).

Conditions suitable to cure invention die attach compositions comprise subjecting the above-described assembly to a temperature of less than about 300° C. for about 0.5 up to about 2 minutes. This rapid, short duration heating can be accomplished in a variety of ways, e.g., with an in-line heated rail, a belt furnace, or the like.

Alternatively, conditions suitable to cure invention die attach compositions comprise subjecting the above-described assembly to a temperature in the range of about 120° C. up to about 200° C. for a period of about 15 minutes up to about 60 minutes. These conditions can be readily produced in a variety of ways, such, for example, by placing the above-described assembly in a curing oven.

In a further aspect of the invention, there are provided methods for controlling adhesive gap thickness between a device and a substrate, the method comprising subjecting a sufficient quantity of an invention adhesive composition positioned between the substrate and the device to conditions suitable to cure the adhesive composition, wherein the spacers control adhesive gap thickness between the device and the substrate.

In a still further aspect of the invention, there are provided methods for maintaining planarity across an adhesive bond line, the method comprising subjecting a sufficient quantity of an invention adhesive composition positioned between a substrate and a device to conditions suitable to cure the adhesive composition, wherein the spacers maintain planarity across the bond line between the device and the substrate.

In yet another aspect of the invention, there are provided methods for creating substantially uniform bond lines between at least two semiconductor dice attached to a substrate in a stacked arrangement, the method comprising subjecting a sufficient quantity of an invention adhesive composition positioned between the substrate and each of the dice to conditions suitable to cure the adhesive composition.

In a still further aspect of the invention, there are provided methods for adhesively attaching at least two semiconductor dice to a substrate in a stacked arrangement without the need for a spacer die, the method comprising subjecting a sufficient quantity of an invention adhesive composition positioned between the substrate and each of the dice to conditions suitable to cure the adhesive composition.

In another aspect of the invention, there are provided methods for controlling bond line thickness between semiconductor dice in an assembly comprising a plurality of semiconductor dice in a stacked arrangement, the method comprising subjecting an adhesive composition positioned between each of said dice to conditions suitable to cure the adhesive composition.

In accordance with yet another aspect of the present invention, there are provided assemblies of components adhered together employing invention adhesive compositions. Thus, for example, assemblies comprising a first article permanently adhered to a second article by a cured aliquot of invention adhesive compositions are provided. Articles contemplated for assembly employing invention compositions include memory devices, ASIC devices, microprocessors, flash memory devices, and the like.

In yet another aspect of the present invention, there are provided assemblies comprising a substrate and plurality of semiconductor dice positioned on the substrate in a stacked arrangement, wherein each of the semiconductor die is adhered to either the substrate or another die by a cured aliquot of the adhesive composition according to claim 1.

In a still further aspect of the invention, there are provided bond lines in an assembly wherein said assembly comprises at least one semiconductor die, at least one substrate, and an adhesive composition positioned therebetween, wherein the thickness of the bond line is determined by a plurality of spacers in the adhesive formulation. Preferably, the assembly contains bondlines with a thickness in the range of about 3 mils up to about 6 mils.

The invention will now be described in greater detail by reference to the following non-limiting examples.

EXAMPLE

This Example presents bondline data for three different invention adhesive compositions, DR48, DR51, and DR50. Each of these invention compositions was prepared from the same base composition containing the following components:

| | |
|---|---|
| X-Bismaleimide (described in U.S. Pat. Nos. 6,034,194 and 6,034,195) | 34.75% |
| Ricon 130 (Sartomer) | 13.38% |
| Ricon 130 MA (Sartomer) | 5.06% |
| (Glycidoxypropyl) trimethoxysilane (Aldrich) | 2.0% |
| TEFLON ™ (DuPont) | 42% |
| Perkadox 16 (Akzo Chemicals) | 1.12% |
| Triganox 141 (Akzo Chemicals) | 1.69 |

In addition to the components listed above, invention composition DR48 contained 3 to 4 mil spacers, invention composition DR51 contained 4 to 5 mil spacers, and invention composition DR50 contained 5 to 6 mil spacers.

The bondline data presented in Table 2 were obtained on parts comprising a 300×300×14 mil die on top of a 500×500×14 mil, with a placement force of 10N, and cured on a Hot-Block at 150° C. for 1 minute.

TABLE 1

| Average Bondline (from four corners) | | | Max Bondline Tilt (Max Corner - Min Corner) | | |
|---|---|---|---|---|---|
| DR48 | DR51 | DR50 | DR48 | DR51 | DR50 |
| 3.3 | 4.6 | 5.5 | 0.1 | 0.1 | 0.4 |
| 3.2 | 4.5 | 5.3 | 0.4 | 0.2 | 0.3 |
| 3.2 | 4.5 | 5.3 | 0.3 | 0.6 | 0.1 |
| 3.8 | 4.3 | 5.3 | 0.2 | 0.4 | 0.1 |
| 3.2 | 4.5 | 5.4 | 0.3 | 0.4 | 0.4 |
| 3.3 | 4.2 | 4.1 | 0.4 | 0.2 | 0.3 |
| 3.3 | 4.4 | 5.6 | 0.1 | 0.1 | 0.2 |
| 3.3 | 4.4 | 5.3 | 0.5 | 0.1 | 0.3 |
| 3.4 | 4.4 | 5.4 | 0.2 | 0.6 | 0.3 |

TABLE 1-continued

| | Average Bondline (from four corners) | | | Max Bondline Tilt (Max Corner - Min Corner) | | |
|---|---|---|---|---|---|---|
| | DR48 | DR51 | DR50 | DR48 | DR51 | DR50 |
| | 3.6 | 4.3 | 5.3 | 0.5 | 0.3 | 0.3 |
| x-bar | 3.36 | 4.41 | 5.25 | 0.30 | 0.30 | 0.27 |

(All values above are in mils)

As readily ascertained from the bondline data shown Table 2, each invention composition provides a bondline thickness which corresponds to the size of the spacers chosen for each formulation. For example, invention composition DR51 which contains 4 to 5 mil spacers, provides a bondline thickness of 4.41 mils. In addition, the data presented in Table 2 clearly indicate that each invention composition provides substantially uniform planarity across the entire bondline.

While the invention has been described in detail with reference to certain preferred embodiments thereof, it will be understood that modifications and variations are within the spirit and scope of that which is described and claimed.

What is claimed is:

1. An adhesive composition comprising at least one maleimide-containing monomer, optionally at least one cure initiator, and a plurality of spacers constructed from one or more organic polymers.

2. The adhesive composition according to claim 1, wherein said spacers are substantially spherical.

3. An adhesive composition comprising at least one maleimide-containing monomer, optionally at least one cure initiator, and a plurality of spacers constructed from one or more organic polymers, wherein said spacers have a particle size in the range of about 0.02 mils up to about 25 mils.

4. The adhesive composition according to claim 3, wherein said spacers have a particle size in the range of about 0.1 mils up to about 15 mils.

5. The adhesive composition according to claim 1, wherein said organic polymers are substantially uncrosslinked.

6. The adhesive composition according to claim 1, wherein said organic polymers are polymerization products of optionally substituted ethylenically unsaturated monomers.

7. An adhesive composition comprising at least one maleimide-containing monomer, optionally at least one cure initiator, and a plurality of spacers constructed from one or more organic polymers, wherein said organic polymers are polymerization or copolymerization products of α-olefins, (meth)acrylates, vinyl esters, acrylamides, or acrylonitriles.

8. The adhesive composition according to claim 1, wherein said organic polymers are polymerization or copolymerization products of (meth)acrylates.

9. The adhesive composition according to claim 1, wherein said organic polymer is polymethylmethacrylate.

10. The adhesive composition according to claim 9, wherein said polymethylmethacrylate has a molecular weight in the range of about 50,000 up to about 1,500,000.

11. The adhesive composition according to claim 9, wherein said polymethylmethacrylate has a molecular weight in the range of about 400,000 up to about 500,000.

12. The adhesive composition according to claim 1, wherein said maleimide-containing monomer has the following structure:

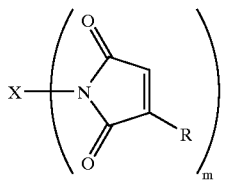

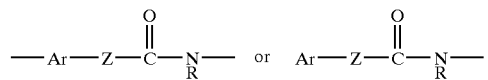

wherein
Z is O or NR, wherein R is hydrogen or lower alkyl, (V) urethanes having the structure

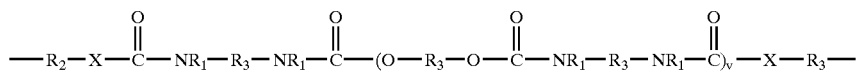

wherein:
m=1–6,
each R is independently selected from hydrogen or lower alkyl, and
X is a monovalent moiety or a multivalent linking moiety.

13. An adhesive composition according to claim 12, wherein said monovalent moiety or multivalent linking moiety is selected from (I) straight or branched chain alkyl, alkylene, oxyalkylene, alkenyl, alkenylene, oxyalkenylene, ester, or polyester, optionally containing substituents selected from hydroxy, alkoxy, carboxy, nitrile, cycloalkyl or cycloalkenyl, (II) siloxanes having the structure:

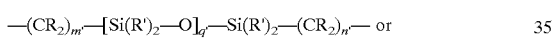

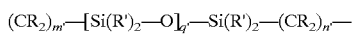

wherein
each R is independently defined as above,
and each R' is independently selected from hydrogen, lower alkyl or aryl, m' falls in the range of 1 up to 10, n' falls in the range of 1 up to 10, and q' falls in the range of 1 up to 50, (III) polyalkylene oxides having the structure:

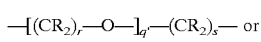

wherein each R is independently as defined above, r falls in the range of 1 up to 10, s falls in the range of 1 up to 10, and q' is as defined above, (IV) aromatic moieties having the structure:

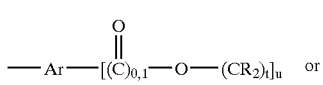

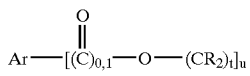

wherein each R is independently as defined above, t falls in the range of 2 up to 10, u is 1, 2 or 3, and Ar is as defined above, or wherein:
each $R_1$ is independently hydrogen or lower alkyl,
each $R_2$ independently is an alkyl, aryl, or arylalkyl group having 1 to 18 carbon atoms;
$R_3$ is an alkyl or alkyloxy chain having up to about 100 atoms in the chain, which chain may contain aryl substituents;
X is O, S, N, or P; and
v is 0 to 50, (VI) aromatic moieties having the structure:

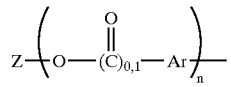

wherein
each Ar is a monosubstituted, disubstituted or trisubstituted aromatic or heteroaromatic ring having in the range of 3 up to about 10 carbon atoms,
n is 1 up to about 50, and
Z is selected from:
straight or branched chain alkyl, alkylene, oxyalkylene, alkenyl, alkenylene, oxyalkenylene, ester, or polyester, optionally containing substituents selected from hydroxy, alkoxy, carboxy, nitrile, cycloalkyl or cycloalkenyl,
siloxanes having the structure:

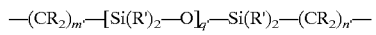

wherein
each R is independently defined as above, and each R' is independently selected from hydrogen, lower alkyl or aryl, m' falls in the range of 1 up to 10, n' falls in the range of 1 up to 10, and q' falls in the range of 1 up to 50,
polyalkylene oxides having the structure:

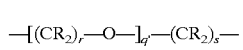

wherein each R is independently as defined above, r falls in the range of 1 up to 10, s falls in the range of 1 up to 10, and q' is as defined above,
aromatic moieties having the structure:

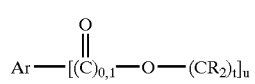

wherein each R is independently as defined above, t falls in the range of 2 up to 10, u is 1, 2 or 3, and Ar is as defined above, as well as mixtures of any two or more thereof.

14. The adhesive composition according to claim 1, wherein said cure initiator is a free-radical cure initiator.

15. The adhesive composition according to claim 14, wherein said free-radical cure initiator is a member selected from the group consisting of peroxy ester, peroxy carbonate, hydroperoxide, alkylperoxide, arylperoxide, or azo compound.

16. An adhesive composition according to claim 1, wherein said composition comprises in the range of about 1 wt % up to about 95 wt % at least one maleimide-containing monomer, in the range of about 0.2 wt % up to about 2.0 wt % at least one cure initiator, and in the range of about 1 wt % up to about 95 wt % at least one spacer constructed from one or more organic polymers.

17. An adhesive composition according to claim 16, wherein said composition comprise in the range of about 1 wt % up to about 50 wt % at least one spacer constructed from one or more organic polymers.

18. An adhesive composition according to claim 17, wherein said composition comprises in the range of about 1 wt % up to about 10 wt % at least one spacer constructed from one or more organic polymers.

19. An adhesive composition according to claim 1, further comprising at least one coupling agent.

20. An adhesive composition according to claim 1, further comprising at least one filler different from the spacer constructed from one or more organic polymers.

21. An adhesive composition according to claim 20, wherein said filler is conductive.

22. An adhesive composition according to claim 20, wherein said filler is electrically conductive.

23. An adhesive composition according to claim 20, wherein said filler is thermally conductive.

24. An adhesive composition according to claim 20, wherein said filler is non-conductive.

25. An adhesive composition according to claim 20, wherein said filler is a perfluorinated hydrocarbon polymer.

26. An adhesive composition according to claim 20, wherein said filler is present in the range of about 1 wt % up to about 95 wt %.

27. An adhesive composition comprising in the range of about 1 wt % up to about 95 wt % at least one maleimide-containing monomer, in the range of about 0.2 wt % up to about 2.0 wt % at least one cure initiator, in the range of about 0.5 wt % up to about 5 wt % at least one coupling agent, in the range of about 1 wt % up to about 95 wt % at least one filler, and in the range of about 1 wt % up to about 50 wt % spacer constructed from one or more organic polymers.

28. A method for creating a substantially uniform bond line between a device and a substrate, said method comprising subjecting a sufficient quantity of an adhesive formulation according to claim 1 positioned between said substrate and said device to conditions suitable to cure said adhesive formulation, wherein said spacers control bond line thickness between said device and said substrate.

29. The method according to claim 28, wherein said bond line thickness is determined by the size of said spacers.

30. The method according to claim 28, wherein said device is a semiconductor die.

31. A method for controlling adhesive gap thickness between a device and a substrate, said method comprising subjecting a sufficient quantity of an adhesive formulation according to claim 1 positioned between said substrate and said device to conditions suitable to cure said adhesive formulation, wherein said spacers control adhesive gap thickness between said device and said substrate.

32. A method for maintaining planarity across an adhesive bond line, said method comprising subjecting a sufficient quantity of an adhesive formulation according to claim 1 positioned between a substrate and a device to conditions suitable to cure said adhesive formulation, wherein said spacers maintain planarity across the bond line between said device and said substrate.

33. The method according to claim 31, wherein said device is a semiconductor die.

34. A method for creating substantially uniform bond lines between at least two semiconductor dice attached to a substrate in a stacked arrangement, said method comprising subjecting a sufficient quantity of an adhesive formulation according to claim 1 positioned between said substrate and each of said dice to conditions suitable to cure said adhesive formulation.

35. A method for adhesively attaching at least two semiconductor dice to a substrate in a stacked arrangement without the need for a spacer die, said method comprising subjecting a sufficient quantity of an adhesive formulation according to claim 1 positioned between said substrate and each of said dice to conditions suitable to cure said adhesive formulation.

36. A method for controlling bond line thickness between semiconductor dice in an assembly comprising a plurality of semiconductor dice in a stacked arrangement, said method comprising subjecting a sufficient quantity of an adhesive formulation according to claim 1 positioned between each of said dice to conditions suitable to cure said adhesive formulation.

37. An assembly comprising a first article adhered to a second article by a cured aliquot of the adhesive composition according to claim 1.

38. An assembly comprising at least one semiconductor die, at least one substrate, and an adhesive composition forming a bond line therebetween, wherein the thickness of said bond line is determined by a plurality of spacers in said adhesive formulation.

39. An assembly according to claim 38, wherein the thickness of said bond line is in the range of about 3 mils up to about 6 mils.

40. An adhesive composition comprising at least one maleimide-containing monomer, optionally at least one cure initiator, and a plurality of spacers constructed from one of more organic polymers, wherein said spacers constructed from one or more organic polymers include at least one reactive moiety.

41. A die-attach paste comprising an adhesive composition according to claim 1, and optionally a filler different from said spacers constructed from one or more organic polymers.

42. An assembly comprising a substrate and plurality of semiconductor dice positioned on said substrate in a stacked arrangement, wherein each of said semiconductor die is adhered to either the substrate or another die by a cured aliquot of the adhesive composition according to claim 1.

* * * * *